United States Patent
Hedler et al.

(10) Patent No.: US 6,927,157 B2
(45) Date of Patent: Aug. 9, 2005

(54) INTEGRATED CIRCUIT AND METHOD FOR PRODUCING A COMPOSITE COMPRISING A TESTED INTEGRATED CIRCUIT AND AN ELECTRICAL DEVICE

(75) Inventors: Harry Hedler, Germering (DE); Thorsten Meyer, Dresden (DE)

(73) Assignee: Infineon Technologies AG, München (DE)

(*) Notice: Subject to any disclaimer, the term of this patent is extended or adjusted under 35 U.S.C. 154(b) by 0 days.

(21) Appl. No.: 10/637,899

(22) Filed: Aug. 8, 2003

(65) Prior Publication Data
US 2004/0070075 A1 Apr. 15, 2004

(30) Foreign Application Priority Data
Aug. 22, 2002 (DE) .......................................... 102 38 582

(51) Int. Cl.[7] .............................................. H01L 21/44
(52) U.S. Cl. ......................... 438/613; 438/614; 257/737
(58) Field of Search ................................. 438/613, 614, 438/612; 257/737, 738, 780

(56) References Cited

U.S. PATENT DOCUMENTS

| 4,740,700 A | 4/1988 | Shaham et al. ............. 250/332 |
| 5,431,328 A | 7/1995 | Chang et al. ........... 228/180.22 |
| 5,477,087 A | 12/1995 | Kawakita et al. ........... 257/737 |
| 6,727,586 B2 * | 4/2004 | Frankowsky et al. ........ 257/737 |
| 2002/0130412 A1 * | 9/2002 | Nagai et al. ................. 257/737 |
| 2002/0140094 A1 * | 10/2002 | Kubota et al. .............. 257/737 |
| 2003/0052407 A1 * | 3/2003 | Hedler et al. ............... 257/734 |

FOREIGN PATENT DOCUMENTS

| DE | 101 35 308 A1 | 2/2003 |
| EP | 0 295 914 A2 | 6/1988 |
| WO | 01/75969 A1 | 10/2002 |

* cited by examiner

Primary Examiner—Phat X. Cao
(74) Attorney, Agent, or Firm—Jenkins, Wilson & Taylor, P.A.

(57) ABSTRACT

Integrated circuit and method for producing a composite comprising a tested integrated circuit and an electrical device. According to one embodiment, a method is provided for producing a composite comprising a tested integrated circuit and an electrical device. The method can include applying a flexible elevation to a circuit substrate of the integrated circuit. Further, the method can include providing a rewiring device on the circuit substrate. The method can also include carrying out of a test of the integrated circuit with temporary utilization of the contact-making device on the flexible elevation. Further, the method can include applying solder to a contact device of the electrical device. The method can also include placing the tested integrated circuit onto the electrical device. In addition, the method can include reliquifying the solder to form a connection between the intergrated circuit and the electrical device.

2 Claims, 2 Drawing Sheets

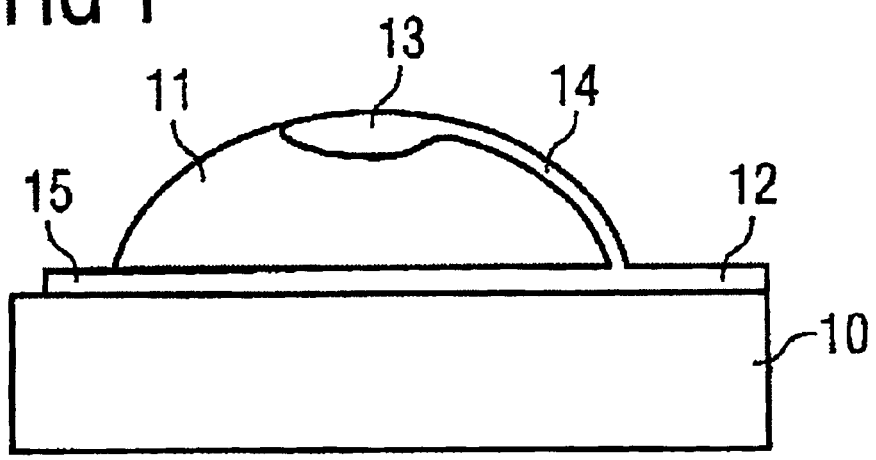
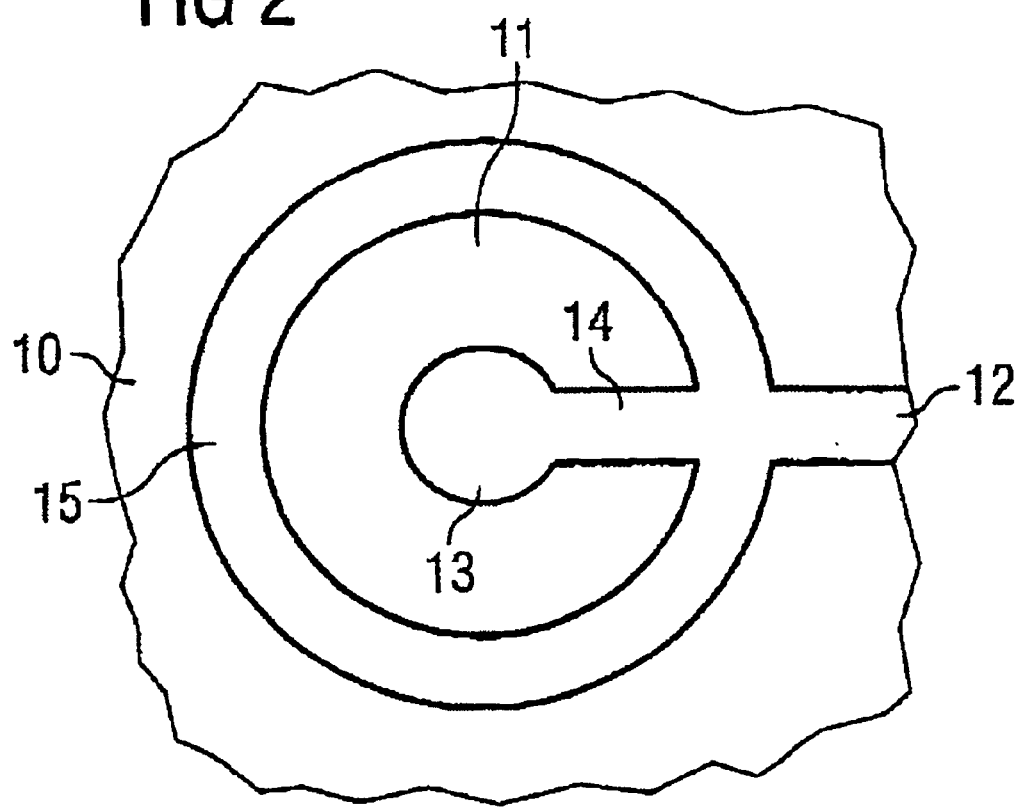

INTEGRATED CIRCUIT AND METHOD FOR PRODUCING A COMPOSITE COMPRISING A TESTED INTEGRATED CIRCUIT AND AN ELECTRICAL DEVICE

TECHNICAL FIELD

Intergrated circuit and method for producing a composite comprising a tested intergrated circuit and an electrical device.

BACKGROUND ART

The present invention relates to an integrated circuit and a method for producing a composite comprising a tested integrated circuit and an electrical device.

Integrated circuits or semiconductor devices in wafer level packages (WLP), in contrast to standard packages, are constructed on a complete, i.e. as yet nondivided, silicon wafer. One advantage of this arrangement is the possibility that the individual, already packaged integrated circuits can already be tested at the wafer level in a parallel process.

Connecting devices or elements e.g. from a package to a printed circuit board in the case of DRAM units or packages used in flip-chip technology have to satisfy two principle requirements: firstly, the DRAM packages must be tested after the packaging of the semiconductor chips or dies. Therefore, the connecting device is used to produce a temporary contact with the test printed circuit board. In order to equalize the height deviations, a connecting device that is flexible or compliant in the Z direction, i.e. normal to the surface of the package, has many advantages. By way of example, an inexpensive test printed circuit can be used on account of the simple contact method by means of a pressure contact-connection with deformation of the flexible connecting device. Expedient testing of the integrated circuit or semiconductor device at the wafer level is possible only with flexible connecting devices or contact-making devices.

The second requirement made of a connecting device consists in providing an electrical contact with a printed circuit board, a further integrated circuit or a module board. It should have a good electrical conductivity and compensate for mechanical stresses which occur on account of the different thermal expansion of chip and printed circuit board, which are normally also supported by a filling material, and has to provide for fixed, robust linking to the printed circuit board or the other integrated circuit.

Standard connecting elements, such as e.g. solder balls, can only ever satisfy one of the two requirements, but not both simultaneously. Solder balls are usually used as fixed connecting devices. With an underfiller they constitute a reliable contact. In order to increase the reliability in the case of connecting elements of the second level, i.e. for permanent electrical linking e.g. to a printed circuit board, rings made of a polymer around the solder ball are known. The strength of a package would already be avoided by the solder balls without an underfiller. During the component test, complex clamp mechanisms have to be used in the case of such an arrangement. For a test at the wafer level, no solution is known with solder balls as connecting devices.

SUMMARY OF THE INVENTION

Therefore, it is an object of the present invention to provide an integrated circuit which has a contact-making device which is suitable both for a functional test of the integrated circuit at the wafer level and for permanent electrical linking, and also to provide a method for producing a tested integrated circuit on an electrical device.

According to the invention, this object is achieved by means of the integrated circuit specified in claim 1 and by means of the method according to claim 12.

The idea underlying the present invention essentially consists in providing a contact-making device which is flexible or compliant for a test of a semiconductor device, e.g. at the wafer level, and has the properties of a conventional solder ball in the event of assembly at the second level, i.e. the linking to a further electrical device, such as, for example, a further integrated circuit or a printed circuit board. The contact-making element is thus flexible for testing the integrated circuit and robust or fixed after mounting on a further electrical device.

In the present invention, the problem mentioned in the introduction is solved in particular by virtue of the fact that an integrated circuit has at least one elastically deformable elevation, on which a contact-making device is provided, which is electrically connected to an active semiconductor section of the circuit substrate via a rewiring device, the rewiring device forming a ring around the elevation at the foot of the elevation. In this way, an electrical connecting device is provided which is flexible for a test at the wafer level and can be embedded in solder for a construction in the composite with a further electrical device, such as a printed circuit board, for example, in order to produce a solder ball-like connecting element.

Advantageous developments and improvements of the respective subject matter of the invention are found in the subclaims.

In accordance with one preferred development, the rewiring device runs in straight, meandering, spiral, wraparound or zigzag fashion on the compliant elevation as far as the contact-making device.

In accordance with one preferred development, the rewiring device has layered metallizations.

In accordance with a further preferred development, the contact-making device has a corrosion-resistant, preferably solder-wettable, surface metallization.

In accordance with a further preferred development, the contact-making device is provided for temporarily making electrical contact with a test or measuring device for carrying out a test of the integrated circuit at the wafer level.

In accordance with a further preferred development, the contact-making device is permanently electrically contact-connected to a further integrated circuit and/or a printed circuit board.

In accordance with a further preferred development, the flexible elevation is completely surrounded by solder in the event of linking to a further integrated circuit and/or a printed circuit board.

In accordance with a further preferred development, the integrated circuit is arranged headfirst, i.e. using flip-chip technology, on the further integrated circuit and/or the printed circuit board.

In accordance with a further preferred development, the compliant elevation is of hemispherical design.

In accordance with a further preferred development, the compliant elevation is produced from a nonconductive basic substance, such as silicone, for example.

Exemplary embodiments of the invention are illustrated in the drawings and explained in more detail in the description below.

BRIEF DESCRIPTION OF THE DRAWINGS

In the figures:

FIG. 1 shows a side view of a detail from an integrated circuit for elucidating an embodiment of the present invention;

FIG. 2 shows a plan view of a detail from an integrated circuit in accordance with FIG. 1 for elucidating an embodiment of the present invention;

DETAILED DESCRIPTION OF THE INVENTION

Figure 3:
FIG. 3 shows a side view of a detail from a printed circuit board for elucidating an embodiment of the present invention.
Figure 4:
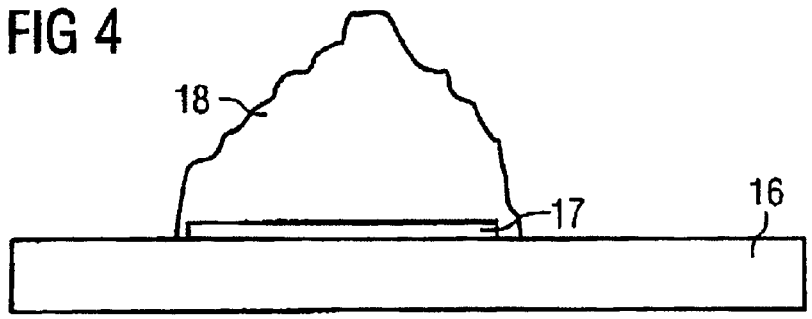
FIG. 4 shows a side view of a detail from a printed circuit board in accordance with FIG. 3 after a further method step for elucidating an embodiment of the present invention.

In the figures, identical reference symbols designate identical or functionally identical component parts.

FIG. 1 shows a side view of a detail from an integrated circuit for elucidating an embodiment of the present invention.

FIG. 1 illustrates a detail from an integrated circuit 10 for a semiconductor device, which is preferably present in wafer form. An elevation 11 is applied to the integrated circuit or the circuit substrate 10, said elevation preferably being composed of an electrically nonconductive flexible or compliant material, such as e.g. silicone, and being formed in particular in hemispherical fashion. A rewiring device 12 is likewise applied to the circuit substrate 10 and is connected, in particular, to an active semiconductor section (not illustrated) on the circuit substrate 10, and preferably has a multilayer construction.

The rewiring device 12 has a section 13 on the tip of the elevation 11, which is flexible in particular in the Z direction, that is to say normal to the surface of the integrated circuit, which forms a contact-making device 13. This contact-making device 13 is provided e.g. in circular fashion and the two sections 14, which connects [sic] the contact-making device 13 to the rewiring device 12 on the semiconductor device 10, [lacuna] preferably formed on the surface of the flexible elevation 11. This connecting section 14 may not only run in the manner illustrated on a direct path between the rewiring device 12 on the circuit substrate 10 and the contact-making device 13 on the flexible elevation 11, but also be provided in spiral, meandering, wraparound or zigzag fashion, thereby affording a better flexibility and breaking strength of the rewiring device 14 on the surface of the flexible elevation 11. Furthermore, the rewiring device 12 has a section 15 on the surface of the circuit substrate 10, which section surrounds the flexible elevation 11 in ring-shaped fashion, preferably in a closed ring 15.

The rewiring device 12, 14, 15 and the contact-making device 13 are produced e.g. by the sputtering on of a carrier layer, the application and patterning of a photoresist in a photochemical process, electrochemical plating of a plurality of further metallizations, removal of the photoresist mask and removal of the carrier layer in etching processes or in another way. This results in a multilayer construction of these devices 12, 13, 14, 15, which have, as termination layer, preferably a corrosion-resistant metallization which, in particular, is readily wettable with solder, such as e.g. a metallization made of gold. Consequently, a flexible connecting device 11, 12, 13, 14, 15 is made which, during a test of the integrated circuit 10 at the wafer level, enables contact-connection of the contact-making device 13 with elastic deformation of the flexible elevation 11 in order to be provided with solder after the test for a permanent electrical contact-connection.

FIG. 2 shows a plan view of a detail from an integrated circuit in accordance with FIG. 1 for elucidating an embodiment of the present invention.

FIG. 2 illustrates the flexible elevation 11, which is circular in plan view, on the circuit substrate 10. On the circuit substrate 10, a rewiring device 12 runs e.g. from an active semiconductor section (not illustrated) of the integrated circuit 10 to a contact-making device 13 situated on the tip of the flexible elevation 11, preferably of circular design. A connecting section 14 on the surface of the flexible elevation 11 is provided between the rewiring device 12 on the circuit substrate 10 and the contact-making device 13 on the flexible elevation 11. The flexible elevation 11 is surrounded by a rewiring ring 15 at the foot of said elevation on the integrated circuit 10, said rewiring ring preferably being closed.

FIGS. 3 to 6 show side views and cross-sectional views from the method for producing a composite of an integrated circuit and a further electrical device, such as a printed circuit board, for example, for elucidating an embodiment of the present invention.

FIG. 3 illustrates an electrical device 16, e.g. a printed circuit board, a further integrated circuit or a connection module, which is provided with a contact device 17, e.g. a bonding pad. In accordance with FIG. 4, solder 18 is applied to the contact device 17, e.g. in a printing process. The solder is preferably present in the form of a solder paste which can be deformed under pressure, for example.

Figure 5:
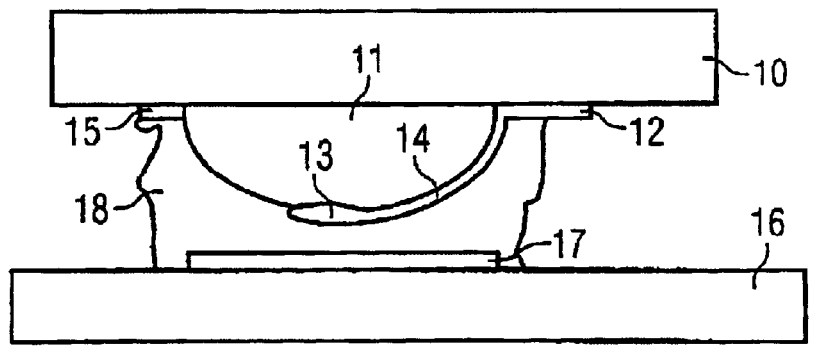
FIG. 5 shows a cross-sectional view of a detail from a composite comprising a printed circuit board and an integrated circuit for elucidating an embodiment of the present invention.

In FIG. 5, an integrated circuit 10 is then aligned headfirst, i.e. using flip-chip technology, with the connecting device 11, 12, 13, 15 above the contact device 17 of the printed circuit board 16, the solder paste 18 preferably being deformed in such a way that it surrounds the entire flexible elevation 11 and makes contact with the ring contact section 15, the contact-making device 13 and the connecting element 14. In other words, the flexible elevation 11 on the circuit substrate 10 is placed or submerged in the solder paste 18.

Figure 6:
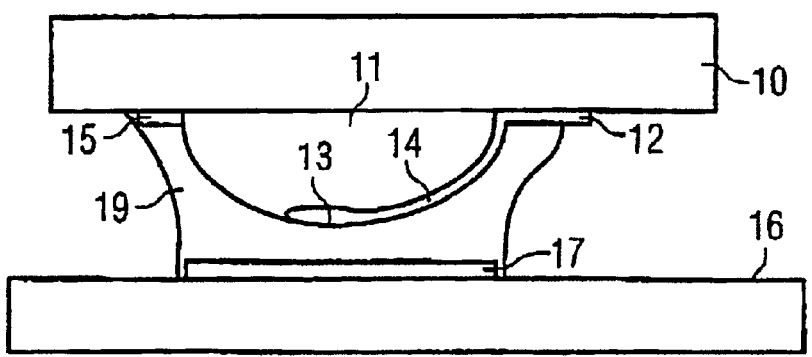
FIG. 6 shows a cross-sectional view of a detail from the composite in accordance with FIG. 5 after a further method step for elucidating an embodiment of the present invention.

FIG. 6 illustrates the arrangement in accordance with FIG. 5, but the solder paste 18 in accordance with FIG. 5 has been heated and thus reliquified and, after cooling, forms a solid solder 19 which preferably encloses the entire flexible elevation 11 and provides a mechanically stable and electrically conductive contact between the circuit substrate 10 and the printed circuit board 16. This structure has properties (mechanical strength, electrical conductivity, . . . ) which are equal to or better than those of a conventional solder ball, in which case, with the same device 11, 12, 13, 14, 15 on which the [sic] circuit substrate or the integrated circuit 10, the latter can be tested in a test at the wafer level, e.g. by means of a measuring device.

Although the present invention has been described above on the basis of a preferred exemplary embodiment, it is not restricted thereto, but rather can be modified in diverse ways.

In particular, the ring around the flexible elevation need not be completely closed or necessarily have a round form, but rather is also conceivable in angular fashion. Furthermore, the composite can also be generated without a flexible solder paste with solid solder. The form of the flexible elevation may likewise be modified, e.g. be embodied in flattened, parallelepipedal or polygonal fashion.

What is claimed is:

1. Method for producing a composite comprising a tested integrated circuit and an electrical device, having the following steps:

(a) applying a flexible elevation to a circuit substrate of the integrated circuit;

(b) providing a rewiring device on the circuit substrate with the formation of a ring around the flexible elevation and on the flexible elevation with the formation of a contact-making device on the flexible elevation, the ring and the contact-making device being electrically conductively connected to one another;

(c) carrying out of a test of the integrated circuit with temporary utilization of the contact-making device on the flexible elevation;

(c) applying solder to a contact device of the electrical device;

(d) placing the tested integrated circuit or the circuit substrate onto the electrical device with the contact-making device being aligned with the contact device—provided with solder—of the electrical device; and (e) reliquifying the solder in such a way that it forms a permanent, fixed, electrically conductive connection between the integrated circuit and the electrical device, wherein the solder completely surrounds the flexible elevation upon reliquifaction.

2. Method according to claim 1, wherein the electrical device is a further tested intergrated circuit and/or a printed circuit board.

* * * * *